(12) United States Patent
Gunamony

(10) Patent No.: US 11,408,951 B2
(45) Date of Patent: Aug. 9, 2022

(54) OPEN-FACE, DUAL-MODE HEAD COIL FOR CLINICAL IMAGING IN ULTRA-HIGH FIELD MRI SCANNER

(71) Applicant: MR CoilTech Limited, Glasgow (GB)

(72) Inventor: Shajan Gunamony, Glasgow (GB)

(73) Assignee: MR CoilTech Limited, Glasgow (GB)

( * ) Notice: Subject to any disclaimer, the term of this patent is extended or adjusted under 35 U.S.C. 154(b) by 55 days.

(21) Appl. No.: 16/857,649

(22) Filed: Apr. 24, 2020

(65) Prior Publication Data

US 2021/0333339 A1 Oct. 28, 2021

(51) Int. Cl.
  *G01R 33/28* (2006.01)
  *G01R 33/422* (2006.01)
  *G01R 33/44* (2006.01)

(52) U.S. Cl.
  CPC ......... *G01R 33/283* (2013.01); *G01R 33/422* (2013.01); *G01R 33/445* (2013.01)

(58) Field of Classification Search
  CPC ... G01R 33/283; G01R 33/422; G01R 33/445
  See application file for complete search history.

(56) References Cited

U.S. PATENT DOCUMENTS

| | | | |
|---|---|---|---|
| 4,594,566 A | | 6/1986 | Maudsley |
| 4,694,255 A | * | 9/1987 | Hayes .............. G01R 33/34046 324/318 |
| 5,311,868 A | * | 5/1994 | Carbini ............... A61B 90/10 600/417 |
| 5,517,120 A | * | 5/1996 | Misic ............... G01R 33/34046 324/318 |
| 6,029,082 A | * | 2/2000 | Srinivasan ....... G01R 33/34046 324/318 |
| 6,441,612 B1 | * | 8/2002 | Shimo .............. G01R 33/34053 324/307 |

(Continued)

FOREIGN PATENT DOCUMENTS

WO WO 2018/097863 5/2018

OTHER PUBLICATIONS

Adriany et al., "Transmit and Receive Transmission Line Arrays for 7 Tesla Parallel Imaging", Magnetic Resonance in Medicine, vol. 53, pp. 434-445, 2005.

(Continued)

*Primary Examiner* — Dixomara Vargas
(74) *Attorney, Agent, or Firm* — Caesar Rivise, PC

(57) ABSTRACT

A head coil apparatus for MRI of a person's head includes a transmit coil array device generating RF fields for spin state excitation to the head, wherein the transmit coil array device comprises multiple transmit coil loops decoupled from each other and arranged on a transmit coil array carrier surrounding an inner head coil space for receiving the head; a receive coil array device for receiving RF resonance signals from the head; a RF shield surrounding the transmit coil array device and the receive coil array device; and a head coil window providing a viewing port through the RF shield and transmit coil array device. The head coil window has a longitudinal extension and an azimuthal extension, the transmit coil loops includes a window coil loop surrounding the head coil window, and the coil loop is decoupled from a neighbouring transmit coil loop by sharing a common loop conductor.

20 Claims, 6 Drawing Sheets

(56) References Cited

U.S. PATENT DOCUMENTS

| | | | |
|---|---|---|---|
| 6,591,128 B1* | 7/2003 | Wu | G01R 33/34084 324/318 |
| 6,784,665 B1* | 8/2004 | Chan | G01R 33/34046 324/309 |
| 6,975,114 B1 | 12/2005 | Ledden | |
| 7,012,429 B1 | 3/2006 | Ledden | |
| 7,659,719 B2 | 2/2010 | Vaughan et al. | |
| 7,893,693 B2 | 2/2011 | Vaughan et al. | |
| 8,030,928 B2* | 10/2011 | Li | G01R 33/34046 324/318 |
| 8,046,046 B2* | 10/2011 | Chan | G01R 33/3415 600/422 |
| 8,055,326 B1* | 11/2011 | Dworkin | G01R 33/307 600/422 |
| 8,190,237 B2* | 5/2012 | Driemel | G01R 33/3415 600/422 |
| 9,134,389 B2* | 9/2015 | Driemel | G01R 33/34084 |
| 9,841,473 B2* | 12/2017 | Driemel | G01R 33/34084 |
| 10,004,423 B2 | 6/2018 | Driemel | |
| 10,168,402 B2 | 1/2019 | Gunamony et al. | |
| 10,545,203 B2* | 1/2020 | Driemel | G01R 33/34084 |
| 2002/0070828 A1* | 6/2002 | Vaughan | G01R 33/3453 335/216 |
| 2004/0027128 A1* | 2/2004 | Vaughan | G01R 33/34046 324/318 |
| 2004/0030238 A1* | 2/2004 | Vaughan | G01R 33/283 600/418 |
| 2005/0275403 A1* | 12/2005 | Pinkerton | G01R 33/365 324/318 |
| 2006/0001426 A1* | 1/2006 | Vaughan | G01R 33/34046 324/318 |
| 2006/0241393 A1* | 10/2006 | Liu | A61B 5/055 600/422 |
| 2006/0255806 A1* | 11/2006 | Vaughan | G01R 33/34046 324/318 |
| 2007/0066885 A1* | 3/2007 | Vaughan | G01R 33/34046 600/411 |
| 2007/0085543 A1* | 4/2007 | Vaughan | G01R 33/34046 324/318 |
| 2007/0132454 A1* | 6/2007 | Vaughan | G01R 33/34046 324/318 |
| 2008/0007259 A1* | 1/2008 | Driemel | G01R 33/3415 324/260 |
| 2008/0024133 A1* | 1/2008 | Vaughan | G01R 33/3453 324/318 |
| 2008/0097192 A1* | 4/2008 | Driemel | G01R 33/3415 600/422 |
| 2008/0278167 A1* | 11/2008 | Vaughan, Jr. | G01R 33/345 324/318 |
| 2009/0079432 A1* | 3/2009 | Pinkerton | G01R 33/365 324/322 |
| 2010/0117642 A1* | 5/2010 | Zhai | G01R 33/422 324/307 |
| 2011/0163751 A1* | 7/2011 | Pinkerton | G01R 33/3415 324/322 |
| 2013/0192875 A1* | 8/2013 | Driemel | H02G 15/007 174/135 |
| 2014/0159721 A1* | 6/2014 | Grodzki | G01R 33/48 324/309 |
| 2014/0205140 A1* | 7/2014 | Lovberg | G06T 7/246 382/103 |
| 2015/0323628 A1* | 11/2015 | Wald | G01R 33/341 324/309 |
| 2016/0058397 A1* | 3/2016 | Kim | G01R 33/283 600/418 |
| 2016/0189372 A1* | 6/2016 | Lovberg | G06T 7/246 348/77 |
| 2017/0278237 A1* | 9/2017 | Lovberg | G06T 7/73 |
| 2017/0319143 A1* | 11/2017 | Yu | A61B 5/7485 |
| 2018/0068441 A1* | 3/2018 | Yu | G06T 7/248 |
| 2018/0122069 A1* | 5/2018 | Lovberg | G06T 7/248 |
| 2018/0356477 A1* | 12/2018 | Lau | G01R 33/34046 |
| 2020/0046300 A1* | 2/2020 | Senegas | A61B 5/0077 |
| 2020/0234434 A1* | 7/2020 | Yu | A61B 5/0077 |
| 2020/0289075 A1* | 9/2020 | Anderson | G01R 33/283 |
| 2020/0292644 A1* | 9/2020 | Hou | G01R 33/34007 |
| 2021/0018580 A1* | 1/2021 | Hou | A61B 5/6822 |
| 2021/0121066 A1* | 4/2021 | Rheineck | G01R 33/4814 |
| 2021/0132169 A1* | 5/2021 | Yang | G01R 33/422 |
| 2021/0349164 A1* | 11/2021 | Connell | A61B 5/702 |

OTHER PUBLICATIONS

Avdievich et al., "Improved Longitudinal Coverage for Human Brain at 7T: A 16 Element Transceiver Array", Proceedings of the 19th Annual Meeting of ISMRM, Montreal, Canada, p. 328, 2011.

Hoffmann et al., "Safety Testing and Operational Procedures for Self-Developed Radiofrequency Coils", NMR in Biomedicine, vol. 29, No. 9, pp. 1131-1144, Apr. 6, 2015.

Shajan et al., "A 16-Channel Dual-Row Transmit Array in Combination With a 31-Element Receive Array for Human Brain Imaging at 9.4 T", Magnetic Resonance in Medicine, vol. 71, pp. 870-879, 2013.

Stucht et al., "Highest Resolution In Vivo Human Brain MRI Using Prospective Motion Correction", PLOS One, vol. 10., No. 7, pp. 1-17, Jul. 30, 2015.

Gunamony et al. "An 8-Channel Transmit 32-Channel Receive 7T Head Coil for 1Tx and pTx Scanner Modes", Abstract, SMRT 28th Annual Meeting, Apr. 26, 2019.

* cited by examiner

OPEN-FACE, DUAL-MODE HEAD COIL FOR CLINICAL IMAGING IN ULTRA-HIGH FIELD MRI SCANNER

BACKGROUND OF THE INVENTION

Field of the Invention

The invention relates to a head coil apparatus, being configured for magnetic resonance imaging (MRI) of a human head of a person to be investigated. In particular, the head coil apparatus is configured for use in an ultra-high field MRI scanner, having a magnetic field strength equal to or above 7 T. Furthermore, the invention relates to an MRI scanner apparatus being provided with the head coil apparatus and to a method of magnetic resonance imaging of a head of a person to be investigated. Applications of the invention are available e. g. in the field of clinical head imaging.

Technical Background

In the present specification, reference is made to the following prior art illustrating the technical background of the invention, in particular relating to the configuration and operation of ultra-high field MRI scanners:
[1] U.S. Pat. No. 7,012,429 B1;
[2] U.S. Pat. No. 6,975,114 B1;
[3] G. Adriany et al. "Transmit and receive transmission line arrays for 7 T parallel imaging" in "Magn. Reson. Med." 2005; 53:434-445;
[4] N. I. Avdievich et al. "Improved longitudinal coverage for human brain at 7 T: A 16 element transceiver array" in "Proceedings of the 19th Annual Meeting of ISMRM, Montreal, Canada", 2011. p 328;
[5] G. Shajan et al. "A 16-channel dual-row transmit array in combination with a 31-element receive array for human brain imaging at 9.4 T" in "Magn. Reson. Med." 2014; 71: 870-879;
[6] U.S. Pat. No. 10,168,402 B2
[7] D. Stucht et al. in "PLoS ONE" 10(7): e0133921;
[8] U.S. Pat. No. 7,659,719 B2;
[9] WO 2018/097863 A1;
[10] U.S. Pat. No. 10,004,423 B2;
[11] U.S. Pat. No. 7,893,693 B2;
[12] U.S. Pat. No. 4,594,566; and
[13] J. Hoffmann et al. "Safety testing and operational procedures for self-developed radiofrequency coils NMR" in "Biomedicine" 29(9) 1131-1144.

It is generally known that a large body coil, installed in the magnet bore of an MRI scanner, is used to apply RF power for spin excitation in conventional clinical MRI scanners operated with main magnetic field strengths of 1.5 T or 3 T. However, this approach is not feasible at a field strength of 7 T, as the excitable Larmor frequency is changed and RF power with shorter wavelengths is required. Shorter wavelengths create interferences within the extension of the head, so that inhomogeneous images could result. For avoiding inhomogeneous images, transmit coil arrays are used, which allow to correct amplitude and phase of the transmitted RF power such that inhomogeneities by interferences are compensated. Thus, arrays of local transmit coils are required along with local receive arrays for spin excitation and signal reception at 7 T MRI scanners.

Accordingly, multi-channel RF transmit arrays are an essential tool for imaging at ultra-high field (field strength of main magnetic field ≥7 T). 7 T MRI scanners are described e. g. in [1], wherein paraxially distributed transmission line coils are employed, or in [2], in particular relating to methods for transmit excitation in MRI. Each 7 T MRI scanner can operate in a single transmit mode or in a parallel transmit mode. The 7 T MRI scanner can use e. g. a single channel transmit/32-channel receive head coil for the so-called single channel transmit mode (sTx mode) or an 8-channel transmit/32-channel receive coil for the so-called parallel channel transmit mode (pTx mode).

A variety of transmit array designs based on loops, microstrips dipoles as well as single and dual-row designs are used for imaging the human brain at 7 T (see e. g. [3], [4]). A 16-channel transmit and 32-channel receive coil for human brain imaging at 9.4 T is described in [5] and [6]. A 16-channel dual-row transmit coil provides additional degrees of freedom to generate a uniform image in ultra-high field MRI scanners.

Despite of the recent progress in development, the available ultra-high field MRI head coils have the following limitations. An important design consideration in a transmit coil array is the transmit efficiency. In particular at 7 T, optimum transmit efficiency is achieved when the transmit coil is surrounded by an RF shield. Therefore, practically used head coils have a local RF shield and hence the coil setup forms a complete tube around the head. Continuously surrounding the head by the RF shield has multiple disadvantages. Firstly, the head coil can be claustrophobic to patients. Furthermore, direct patient motion monitoring is impossible during the scan. Current indirect patient motion characterization setups require the use of bite-bars (see e. g. [7]). However, bite-bars have a limited reliability, and a separate bite-bar is required for each individual. Another disadvantage of conventional birdcage head coils for sTx mode of the 7 T MRI scanners is limited brain coverage (see FIG. 12A described below).

For avoiding the claustrophobic effect, [8] describes an open face design for patient access. However, the head coil of [8] is not particularly adapted for an ultra-high field MRI scanner, and it is limited to the use of a distributed-element TEM resonator for RF transmission, which has disadvantages in terms of limited robustness and limited power handling capability.

Furthermore, an open-face design and look-out mirrors for direct patient monitoring are features available in conventional clinical (1.5 T/3 T) head coils (see e. g. [9], [10], [11] and [12]). However, this feature was lost in 7 T MRI scanners because of the need for a local transmit coil and RF shield surrounding the head.

An additional substantial limitation of conventional head coils results from the application of two versions of head coils, using the sTx mode or the pTx mode, resp. Thus, available 7 T MRI scanners use two separate head coils, one for each of the single and parallel transmit scanner modes. Due to the high costs of each single head coil, substantial costs of the MRI scanner result.

BRIEF SUMMARY OF THE INVENTION

A benefit of the invention is to provide an improved head coil apparatus configured for use in an ultra-high field MRI scanner, said head coil apparatus avoiding disadvantages of conventional techniques. In particular, according to a first aspect, the head coil apparatus is to be capable of transmitting RF power with high efficiency, avoiding a claustrophobic effect on the person to be investigated, providing improved brain coverage and/or allowing a direct monitoring of the head of the person to be investigated. According to a second aspect, the head coil apparatus is to be capable of both of sTx and pTx mode operation. Another benefit of the invention is to provide an improved MRI scanner apparatus and an improved method of magnetic resonance imaging of a head of a person to be investigated, avoiding disadvantages of conventional techniques.

The above benefits may be provided by head coil apparatuses for use with an ultra-high field MRI scanner, an ultra-high field MRI scanner and a method of magnetic resonance imaging of a head of a person to be investigated with an ultra-high field MRI scanner, comprising the features of the independent claims. Preferred embodiments of the invention are defined in the dependent claims.

According to a first general aspect of the invention, the above benefits may be provided by a head coil apparatus, being configured for magnetic resonance (MR) imaging of a head of a person to be investigated.

The head coil apparatus comprises a transmit coil array device being arranged for generating radiofrequency (RF) fields for spin state excitation to the head. The transmit coil array device is a discrete-element loop based resonator, and it comprises multiple transmit coil loops, which are decoupled from each other by mutually geometrically overlapping and inductively decoupling and which are arranged on a transmit coil array carrier. The transmit coil loops are configured for coupling with a control device, providing control currents for driving the transmit coil array device. The transmit coil array device has a nested arrangement of the transmit coil loops, wherein adjacent loops are overlapped. There is an inductive decoupling implemented between the next neighbouring elements. Advantageously, the loop design of the transmit coil loops is robust and handles high power, as the total voltage induced is distributed across all the discrete capacitors. The transmit coil array carrier extends parallel to a longitudinal axis, and it surrounds an inner head coil space for receiving the head of the person to be investigated. In operation, the transmit coil array device preferably completely surrounds the head, with the exception of an opening for introducing the head.

Furthermore, the head coil apparatus comprises a receive coil array device which is arranged for receiving RF resonance signals from the head. Preferably, receive coils of the receive coil array device are arranged on a receive coil array carrier. Typically, the transmit coil array carrier surrounds the receive coil array carrier. The receive coils are configured for coupling with the control device, being further adapted for processing RF resonance signals collected with the receive coil array device. In operation, the receive coil array device preferably surrounds an upper portion of the head, without coverage of the eyes.

The head coil apparatus comprises an RF shield surrounding the transmit coil array device and the receive coil array device. The RF shield is made of an RF blocking material, like a sheet or grid of conducting material, e. g. a metal, and it is provided for minimizing a radiation loss and preserving the efficiency of the transmit array. In operation, the RF shield preferably completely surrounds the head like the transmit coil array device, with the exception of the opening for introducing the head.

According to a first aspect of the invention (in the following: first embodiment), the head coil apparatus comprises at least one head coil window (or: cut-out) providing a viewing port with unobstructed sight (unobstructed passage of light field) between the inner head coil space and a surrounding of the head coil apparatus, in particular through the RF shield and the transmit coil array device. While one single head coil window would be sufficient for providing the above benefits, preferably two head coil windows are provided, as outlined below. Optionally, even more head coil windows can be provided.

Each head coil window has a longitudinal extension parallel to the longitudinal axis and an azimuthal extension along an azimuthal direction relative to the longitudinal axis. The transmit coil loops comprise at least one window coil loop being aligned with the at least one head coil window, and the at least one window coil loop is inductively decoupled from at least one neighbouring transmit coil loop by sharing a common loop conductor. If two head coil windows are provided, two neighbouring window coil loops are arranged, each in alignment with one of the head coil windows. The two neighbouring window coil loops share the common loop conductor extending parallel to the longitudinal direction and running in alignment with a closed section of the head coil apparatus between the head coil windows. The common loop conductor is a conductor including variable capacitors, e. g. two variable capacitors, and optionally at least one invariable capacitor. The variable capacitors can be adjusted such that currents through the loops are balanced and there is no interaction between the neighbouring window coil loops, which share the common loop conductor.

Advantageously, the inventive head coil apparatus provides an open-face design benefit for the person to be investigated: The at least one, preferably two, large cut-out(s) in the RF shield are introduced by adapting the coil design without compromising its performance. This novel open-face design makes the setup less claustrophobic, improves patient monitoring during scans and the patient optionally can see the operator whilst being scanned through a look-out mirror. In particular, preferably two large cutouts improve the acceptance in a clinical environment. Furthermore, the inventive head coil apparatus provides a clinical benefit: The new coil offers whole brain coverage at 7 T even in single channel mode operation which is currently not possible with the birdcage based commercial coils used in single channel mode. The ability to image whole brain at 7 T makes this an effective clinical imaging tool for a whole range of neurological conditions.

The invention is based on the following results obtained by the inventor. Firstly, the RF shield is capable of keeping the above technical function with regard to the region to be investigated, i. e. the head of the person even with the at least one viewing port. A gap in the RF shield creates some field distortions. However, as found and experimentally verified by the inventor, the field distortions have a limited extension (see description of FIG. 13 below). Furthermore, any field distortions, like an asymmetry introduced by opening the RF shield and the different transmit coil loop geometry around the cutouts can be compensated by a control device configuration, in particular by adopting the transmit coil loop phase signals received from the control device. There are no or only neglectable field distortions in the volume range, where the head is located. Secondly, the nested arrangement of the transmit coil loops can be modified by providing the common loop conductor between the at least one window coil loop and at least one neighbouring transmit coil loop, e. g. a second window coil loop, without deteriorating the transmit efficiency or the decoupling of the loops. Thus, an open face design can be obtained even in a head coil apparatus with an RF shield and discrete-element loop based resonators of the transmit coil array device. Furthermore, the commonly shared conductor allows the provision of larger head coil windows. With two head coil windows, a bridge formed by the RF shield and transmit coil array between the windows and covering the nose can be narrowed by e. g. 20 to 30 mm.

According to a second aspect of the invention (in the following: second embodiment) and optionally without the provision of the at least one head coil window, the head coil apparatus with the transmit coil array device, the receive coil array device and the RF shield comprises a mode splitter device which is arranged for a dual mode operation of the transmit coil array device. The mode splitter device is configured for direct connection of each transmit coil loop with a related control channel of the control device in a parallel operation mode or for splitting a common control channel of the control device to the transmit coil loops. Advantageously, the mode splitter device an economic benefit: The dual-mode head coil apparatus can be used in both sTx and pTx modes.

According to a preferred embodiment of the invention, the receive coil array carrier has a helmet shape accommodating the head and spanning the inner head coil space. The viewing port provided by the at least one head coil window extends adjacent to or through the receive coil array carrier. Advantageously, the function of the receive coil array device is kept despite of the provision of the at least one head coil window. As a further advantage, the helmet shape matches the receive coil array carrier to the head shape.

According to a preferred embodiment of the invention, a mirror device can be provided, which deflects a light path from the inner head coil space to an outer monitoring range in a surrounding of the head coil apparatus. Preferably, the light path extends from the inner head coil space through the viewing port to the mirror device in a radial direction relative to the longitudinal axis and from the mirror device to the monitoring range parallel to the longitudinal axis. The mirror device represents a substantial advantage for both the person to be investigated and an operator of the ultra-high field MRI scanner over conventional ultra-high field MRI scanners.

Particularly preferred, the mirror device is movable relative to the at least one head coil window parallel to the longitudinal axis. Advantageously, the movability of the mirror device allows an optimum arrangement of the mirror relative to the eyes of the person to be investigated or even shifting the mirror out of the field of view, e. g. for monitoring the head with an optionally provided camera device.

Another substantial advantage of the invention results from the optionally large size of each head coil window. According to preferred features, the longitudinal extension of the at least one head coil window is at least 5 cm, in particular at least 10 cm and or the azimuthal extension of the at least one head coil window is at least 4 cm, in particular at least 6 cm. With these dimensions, suppression of claustrophobic effects is improved and monitoring of the head is facilitated.

According to a particularly preferred embodiment of the invention, the head coil apparatus comprises two head coil windows and two window coil loops, each of which being aligned with one of the head coil windows. The two window coil loops are decoupled by sharing the common loop conductor extending in longitudinal direction. Preferably, the two window coil loops are arranged without mutual overlap in azimuthal direction. Advantageously, the head coil windows can be aligned with the eyes of the head accommodated by the head coil apparatus. Furthermore, the head coil windows can be dimensioned such that a portion of the face around the eyes is exposed through the viewing ports provided by the windows, thus improving the monitoring of the patient's condition (e. g. colour of skin) or arranging some marker for camera monitoring of the head.

According to a particularly preferred variant of the invention, the head coil apparatus according to the first embodiment comprises the mode splitter device according to the second embodiment. In other words, the head coil apparatus may comprise both of the open face design and the mode splitter device. The mode splitter device generally is a controllable switch being arranged for switching between different operation modes and allowing the dual mode operation of the transmit coil array device. The mode splitter device is configured for direct connection of each transmit coil loop with a related control channel of the control device in the parallel operation mode (parallel-transmit (pTx) mode) or for splitting a common control channel of the control device to the transmit coil loops in the in the single channel (sTx) transmit mode. Preferably, at least in the sTx mode, the mode splitter device can be adapted for adopting the transmit phase supplied to the transmit coil loops for correcting any field distortions introduces by the view port design and the window coil loops.

The 7 T MRI scanner can be operated in two modes, namely the single-channel (sTx) and the parallel-transmit (pTx) modes. Instead of using two separate coils, one for each of the scanner modes, the mode splitter device provides an interface which allows the same head coil apparatus to be used in both the modes of the scanner. Advantageously, this provides a substantial economic benefit to the customer. In sTx mode, the transmit coil array device preferably can be excited in the circularly polarised mode which sets up a sinusoidal excitation. In another version, it is also possible to apply static RF shimming and excite the transmit coil in sTx mode. In pTx mode, the transmit coil array device preferably allows for both the amplitude and phase of the current to each of the loop elements to be independently controlled.

According to a further advantageous embodiment of the invention, a head coil apparatus can be provided with a camera device which is arranged outside the head coil apparatus, e. g. fixed to the MRI scanner. The camera device is configured for imaging a head section of the head of the person to be investigated through the at least one head coil window. Advantageously, the camera device allows a monitoring of the head position and the condition of the person to be investigated. The camera device can be provided in combination with the mirror device, thus allowing camera imaging via the mirror.

According to a second general aspect of the invention, the above benefits may be provided by an MRI scanner apparatus, being configured for MR imaging of a head of a person to be investigated and comprising the head coil apparatus according to the first general aspect of the invention or one of the embodiments thereof. The MRI scanner apparatus comprises a main magnetic field device with a central bore being arranged for receiving the head coil apparatus with the head of the person to be investigated, wherein the main magnetic field device is arranged for creating a main, preferably stationary magnetic field in the central bore, said main magnetic field having a field strength of equal to or above 7 T.

According to a third general aspect of the invention, the above benefits may be provided by a method of MR imaging of a head of a person to be investigated, wherein the head coil apparatus according to the first general aspect of the invention or one of the embodiments thereof and the MRI scanner apparatus according to the second general aspect of the invention or one of the embodiments thereof are used. The method comprises the steps of arranging the person to be investigated such that the head is received by the head coil apparatus and the person can view through the at least one head coil window, arranging the person with the head coil apparatus in the central bore of the MR scanner apparatus, and collecting MR image data with the head coil apparatus.

According to further variants of the inventive method, the person can monitor the surrounding through the at least one head coil window, thus advantageously minimizing claustrophobic effects of the clinical investigation, and/or the person can be monitored by an operator through the at least one head coil window. Preferably, monitoring can be done with the camera device and/or via the mirror device through the at least one head coil window.

BRIEF DESCRIPTION OF SEVERAL VIEWS OF THE DRAWINGS

Further details and advantages of the invention are described in the following with reference to the attached drawings, which schematically show in.

DETAILED DESCRIPTION OF PREFERRED EMBODIMENTS

Features of preferred embodiments of the invention are described in the following with exemplary reference to the provision of a head coil apparatus with two head coil windows and/or the mode splitter device in a 7 T MRI scanner. It is emphasized that the implementation of the invention is not restricted to these embodiments, but alternatively possible with variants, like e. g. a single head coil window with or without a camera device and/or a mirror device, optionally in another ultra-high field MRI scanner. Details of the MRI scanner and the operation thereof are not described as far as they are known as such from conventional MRI scanners. In particular, details of inductively decoupling transmit loops can be provided as known as such from prior art. The figures represent schematic illustrations, wherein some details of practical devices, like electric supply and signal lines and local control circuits of the transmit coil loops are not shown. In practice, the dimensions, orientation and arrangements of the components of the head coil apparatus and the MRI scanner can be adapted to the particular application conditions.

Figure 1:
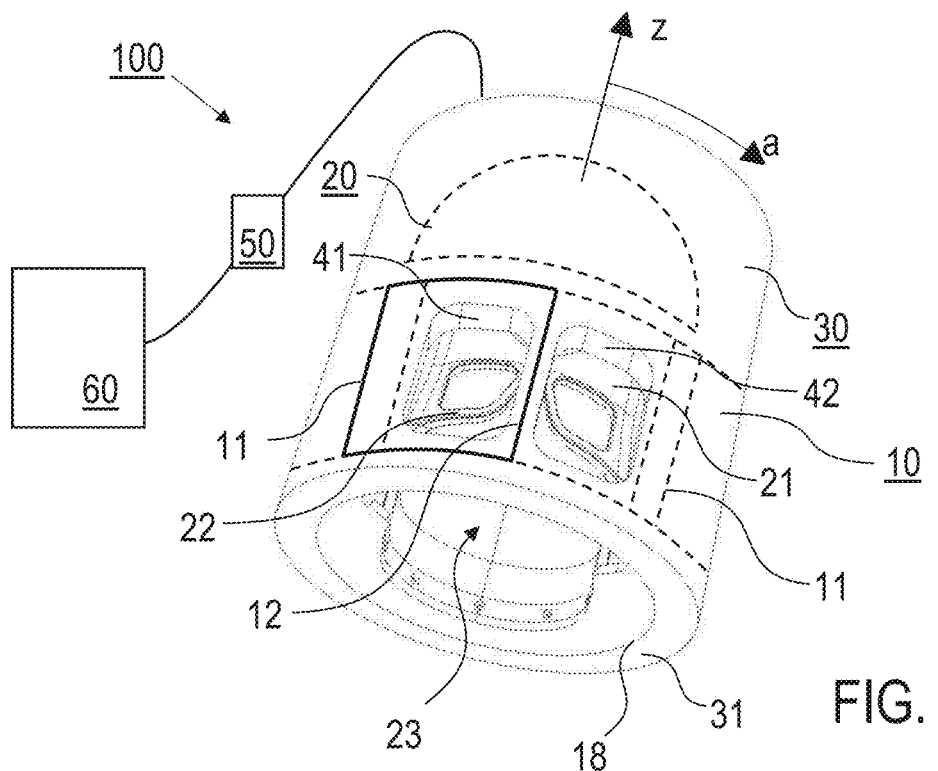
FIG. 1 illustrates a head coil apparatus according to an example of the embodiments.

FIG. 1 shows an outer view of the first embodiment of the head coil apparatus 100 for magnetic resonance imaging of a head of a person to be investigated, with a phantom illustration of the transmit coil array device 10 and the receive coil array device 20, which are arranged on a transmit coil array carrier 18 (illustrated by the inner circle) and a helmet-shaped receive coil array carrier 21 (partially shown, see also FIG. 7), resp. The RF shield 30, optionally including an RF shield carrier 31, provides a cylindrical outer enclosure of the head coil apparatus 100. The RF shield can be arranged on an inner or an outer surface of the RF shield carrier 31. The radial distance between the transmit coil array device 10 and the RF shield 30 can range e. g. from 20 mm to 40 mm.

Figure 5:
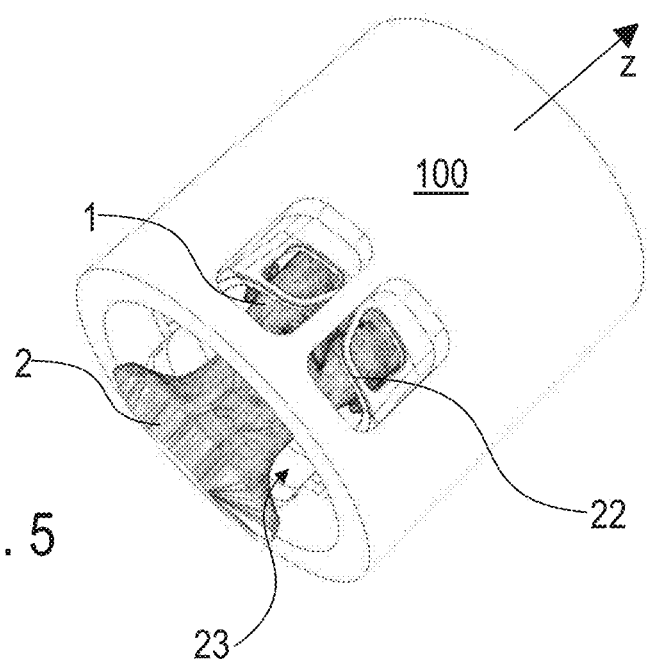
FIG. 5 illustrates an exemplary head coil apparatus.
Figure 9:
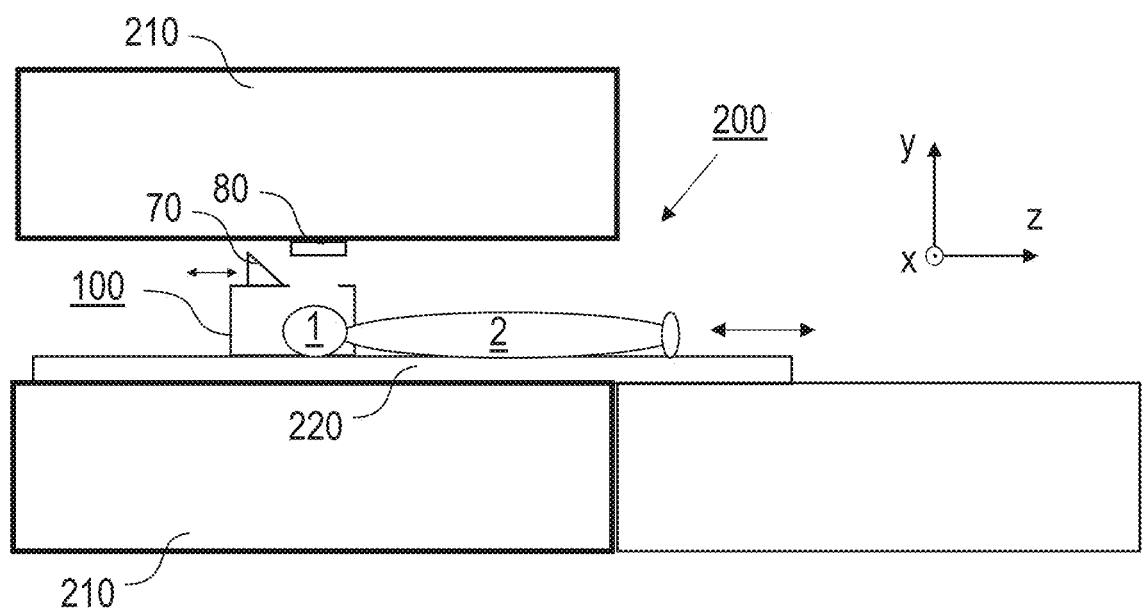
FIG. 9 shows an exemplary MRI scanner according to embodiments of the invention.

The head coil apparatus 100 has a longitudinal direction (longitudinal axis, z-axis) which corresponds to the head-feet-axis of the person to be investigated (see e. g. FIGS. 5 and 9). The transmit coil array device 10 has a longitudinal extension along the longitudinal axis as well. The circumferential direction of the RF shield is the azimuthal direction (arrow a in FIG. 1). Any straight directions perpendicular to the z-axis are called radial directions.

The head coil apparatus 100 has two head coil windows 41, 42 providing a viewing port through the RF shield 30 and the transmit coil array device 10. The head coil windows 41, 42 comprise cut-outs in the material of the components 10, 30, in particular in the transmit coil array carrier 18 and the RF shield 30 and the RF shield carrier 31. A glasses-like portion 22 of the receive coil array carrier 21 protrudes into the viewing port without deteriorating the function thereof. The dimensions of each of the head coil windows 41, 42 are e. g. about 80 mm in azimuthal direction and about 145 mm in longitudinal direction.

As essential features of the invention, the transmit coil array device 10 comprises multiple transmit coil loops, wherein the directly neighbouring loops surrounding and being aligned with the head coil windows 41, 42 are called window coil loops 11 with a common shared common loop conductor 12 between the head coil windows 41, 42. One of the window coil loops 11 is shown with a drawn line for illustration purposes in FIG. 1. The window coil loops 11 do not have a mutual overlap, while the remaining transmit coil loops are arranged with a mutual overlap as it is known from conventional transmit coil arrays and further described below with reference to FIGS. 3 and 4.

The receive coil array device 20 preferably comprises a receive coil array as described in [5] or [6], e. g. a 32-channel receive array, which is a retuned version of a 9.4 T coil disclosed in [5]. The RF shield 30 is made of a metal sheet or foil, made of flexible printed circuit board material (e. g. polyimide) with single or double sided copper with typical thickness of 5 to 12 µm, optionally arranged on the RF shield carrier 31, made of e. g. fibreglass. Alternatively, another number of receive channels can be used, like e. g. 32, 48, 64, 128 or even more.

Figure 2:
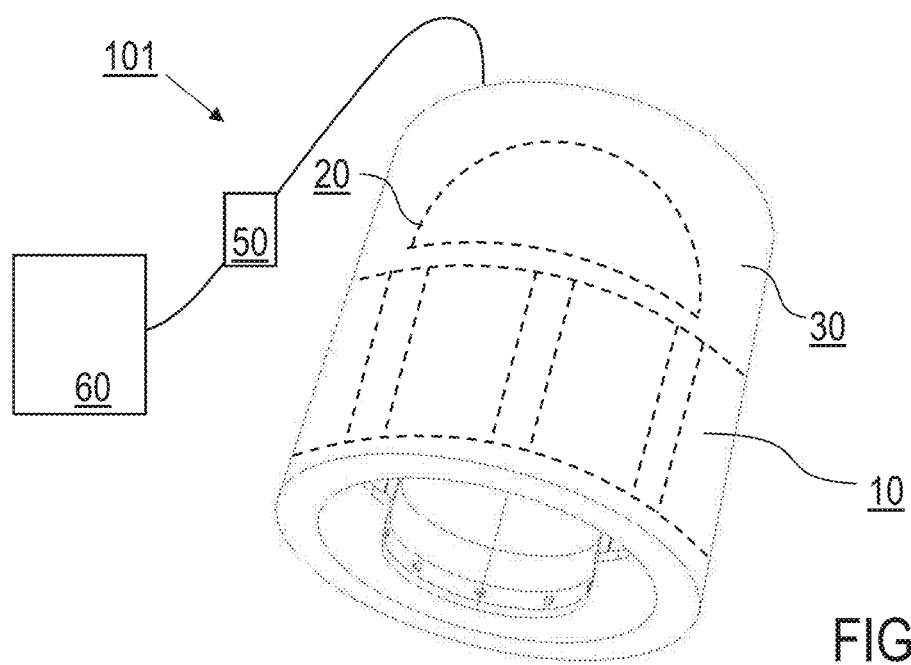
FIG. 2 illustrates a head coil apparatus according to another example of the embodiments.

FIG. 1 further shows that the head coil apparatus 100 is connected with via an optionally provided mode splitter device 50 with a control device 60. According to the second embodiment of the invention, the mode splitter device 50 can be provided with a head coil apparatus 101 which does not have the head coil windows 41, 42, but is closed by the RF shield 30 in all radial directions, as shown in FIG. 2. The second embodiment of the head coil apparatus 101 includes a transmit coil array device 10 and a receive coil array device 20 surrounded by an RF shield 30 as known from prior art ultra-high field MRI scanners. Deviating from the first embodiment, all transmit coil loops of the transmit coil array device 10 are arranged with a mutual overlap of neighbouring loops. Details of the mode splitter device 50 of FIG. 1 or 2 are described below with reference to FIGS. 10 and 11.

Figure 3:
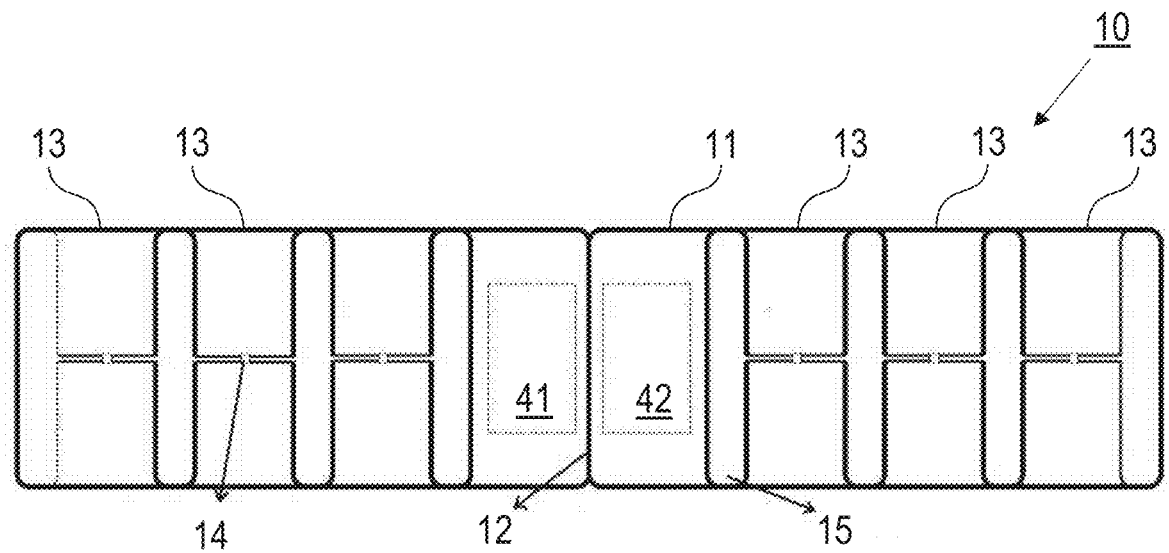
FIG. 3 shows an arrangement of transmit coil loops in a transmit coil array device of a head coil apparatus according to examples of the embodiments.
Figure 6:
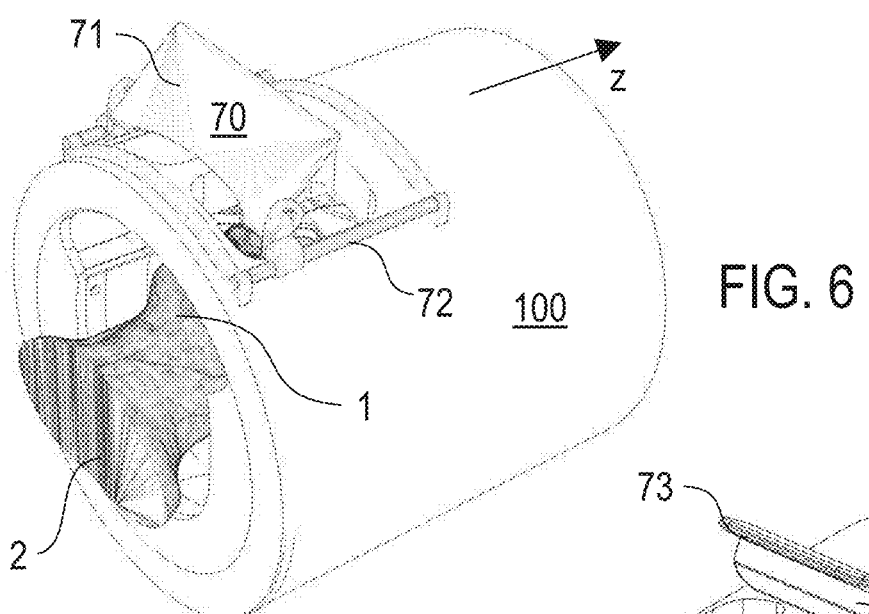
FIG. 6 illustrates another exemplary head coil apparatus.
Figure 7:
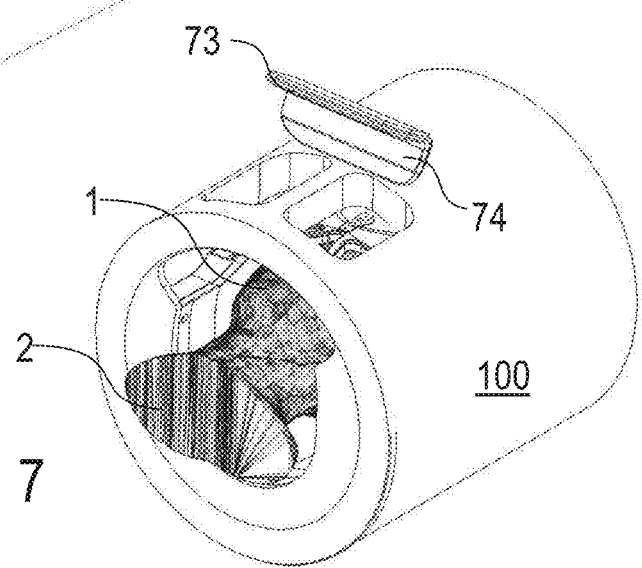
FIG. 7 illustrates yet another exemplary head coil apparatus.

According to the embodiment shown in FIG. 3, the transmit coil array device 10 comprises eight transmit coil loops including the two window coil loops 11 without mutual overlap and six transmit coil loops 13 with a mutual overlap. In practice, the transmit coil loops shown as a 2D view in the drawing plane are arranged on a cylindrical surface of a transmit coil array carrier (not shown), with the window coil loops 11 surrounding the head coil windows 41, 42 and the transmit coil loops azimuthally surrounding the inner head coil space 23 (see FIG. 1). For decoupling, a combination of inductive decoupling 14 and overlap 15 of the mutually overlapping transmit coil loops 13 and shared conductor 12 decoupling of the window coil loops 11 was used. In particular, the two window coil loops 11 surrounding the cutouts 41, 42 are decoupled using the shared conductor 12 to minimize the width of the bridge above the nose of the head of the person to be investigated. This also allows us to include large mirrors in the coil setup similar to conventional 3 T clinical product coils, as shown in FIGS. 6 and 7 below.

In an experimental example, the 8-channel transmit array was designed on a fiberglass tube of 28-cm inner diameter and extended 21-cm along the z-direction. Designing the loop dimensions, arrangement and decoupling was obtained with numerical simulations, e. g. using the software package CST Studio Suite (CST, Darmstadt, Germany). The main design criteria were to provide the open-face design as well as maximizing the transmit efficiency. The outer tube of the RF shield 30 (see FIG. 1) consisted of a slotted double-layered 7 μm shield made of flexible polyimide printed circuit board material with double sided copper at a radial distance of 24 mm from the transmit coil loops. Each transmit coil loop is made of conductors and 12 capacitors in series to tune the element to e. g. 297.2 MHz. After designing the 8-channel transmit array of FIG. 3 in the numerical domain, the performance of the constructed transmit coil array device 10 was in close agreement with the simulated results.

Active detuning of the transmit coil array device 10 can be achieved by adding a diode in series. Internal PIN bias lines can be shared in a way to allow the 8Tx32Rx setup to be interfaced e. g. to the 7 T Siemens Magnetom scanner in both single and pTx modes, as outlined below.

Figure 4:
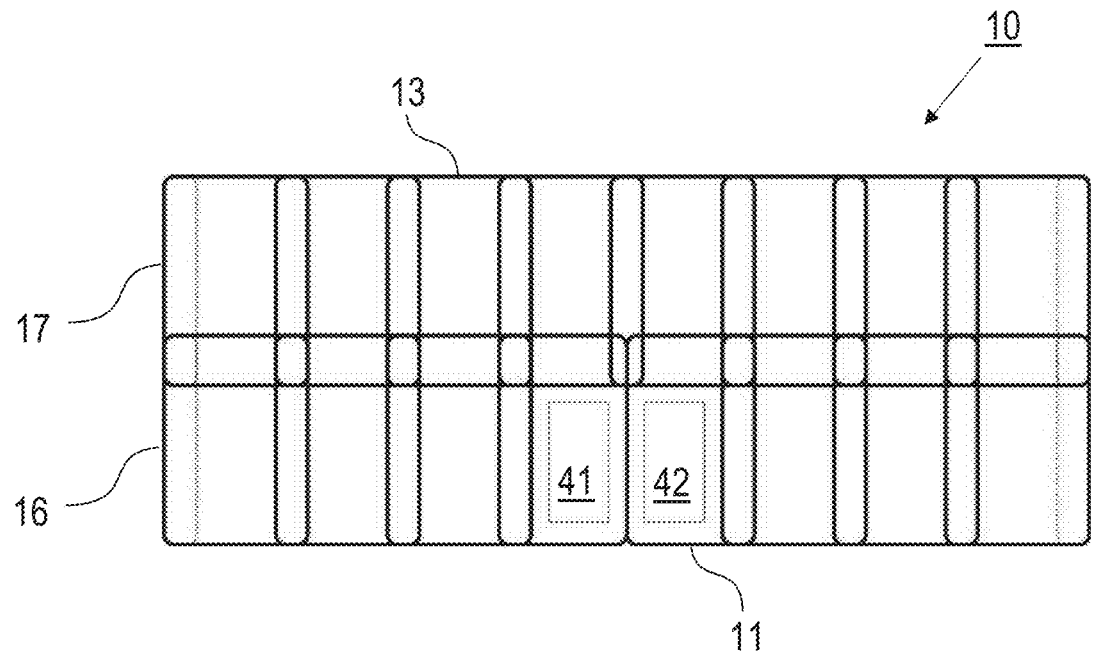
FIG. 4 shows another arrangement of transmit coil loops in a transmit coil array device of a head coil apparatus according to examples of the embodiments.

Depending on the application of the invention, the transmit coil array device 10 may comprise a modified array of transmit coil loops, e. g. as shown in FIG. 4. With this embodiment, the transmit coil array device 10 comprises sixteen transmit coil loops 11, 13, which are arranged in two cylindrical rows 16, 17. The rows 16, 17 are arranged with a mutual overlap in z-direction. Each of the rows 16, 17 comprises eight transmit coil loops 11, 13. The first row 16, aligned with the two head coil windows 41, 42 and including the window coil loops 11, is designed like the transmit coil array device 10 of FIG. 3. The second row 17 is designed like a conventional array of mutually overlapping transmit coil loops. The transmit coil array device 10 of FIG. 4 is numerically designed like the embodiment of FIG. 3.

It is noted that FIGS. 3 and 4 represent schematic illustrations only. In practice, the loops include variable capacitances for adjusting currents in the loop and the resonance frequency of the transmit array device. Furthermore, local driving circuits (not shown) of the coil loops are provided as it is known per se from conventional transmit arrays.

FIGS. 5 to 7 illustrate the head coil apparatus 100 in combination with the head 1 of the person 2 to be investigated. FIG. 5 corresponds to the embodiment of FIG. 1, wherein the head 1 is accommodated by the inner head coil space 23 of the head coil apparatus 100. FIGS. 6 and 7 show examples of a mirror device 70, which is arranged on an outer side of the head coil apparatus 100.

According to FIG. 6, the mirror device 70 comprises a single plane deflection mirror 71 being declined relative to the longitudinal z-axis, e. g. by 45°. The deflection mirror 71 is shiftable with a shifting carrier 72, including e. g. carrier rails. The embodiment of FIG. 6 is adapted for monitoring and/or projecting along a direction from behind, i. e. from the head side of the person 2.

According to FIG. 7, the mirror device 70 comprises two plane deflection mirrors 73, 74 being declined relative to each other and relative to the longitudinal z-axis. The plane deflection mirrors 73, 74 are arranged for monitoring and/or projecting along a direction from a front side, i. e. from the feet side of the person 2.

Figure 8:
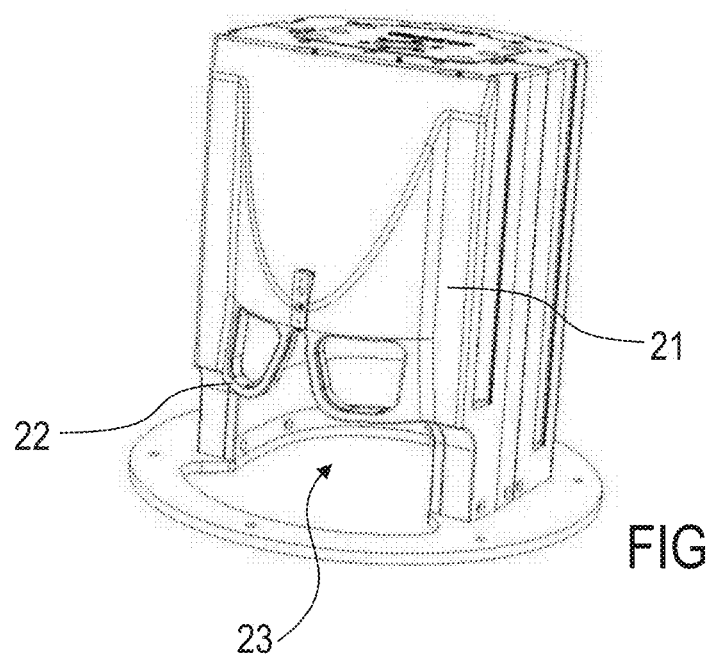
FIG. 8 illustrates further details of a head coil insert portion of the head coil apparatus examples of FIGS. 5 to 7.

FIG. 8 illustrates an insert of the head coil apparatus, including the receive coil array carrier 21 with the glasses-like portion 22 (receive coils not shown). The transmit coil array carrier 18 (see FIG. 1) and the receive coil array carrier 21 therein are dimensioned such that a sufficiently large inner head coil space 23 and a radial distance of the transmit coil loops from the RF shield of at least 20 mm is obtained. With a practical example, the inner diameter of the inner tube of the transmit coil array carrier is 280 mm. The RF shield is attached to the inside of the outer tube, wherein the diameter of the outer tube is about 340 to 350 mm.

An embodiment of a 7 T MRI scanner 200 including the head coil apparatus 100 of the first embodiment of the invention is illustrated with a schematic cross-sectional view in FIG. 9. The MRI scanner 200 is e. g. the Siemens Magnetom scanner, including a main magnet device 210, a gradient field device (not shown), a control device (not shown, e. g. the control device 60 of FIG. 1), a movable carrier table 220 accommodating the person 2 to be investigated, and the head coil apparatus 100 accommodating the head 1 of the person 2. The head coil apparatus 100 is provided with the mirror device 70, e. g. according to FIG. 6.

Furthermore, a camera device 80 is arranged in the bore of the main magnet device 210 for monitoring the head 1 through the viewing ports of the head coil apparatus 100. The camera device 80 comprises e. g. a camera and lighting unit. Alternatively, the camera device 80 can be arranges outside the main magnet device 210 for monitoring the head 1 via the mirror device 70. Advantageously, with the MRI scanner 200 of the invention, a direct motion tracking system can be provided with the 7 T head coil apparatus. The inventive open-face design of the head coil apparatus 100 removes the need for bite-bars as used in [7]. Markers monitored with the camera device 80 can be attached directly to the face of the person 2.

Details of the mode splitter device 50 and the operation thereof are described in the following with reference to FIGS. 10 and 11. The mode splitter device 50 can be provided with the first or second embodiment of the inventive head coil apparatus, i. e. in combination with the at least one viewing port or with a closed RF shield/usual transmit coil array. The control device 60 (see FIGS. 1 and 2) includes a number of RF amplifiers corresponding to the number of transmit coil loops of the transmit coil array device, wherein at least one of the RF amplifiers is used for driving the transmit coil array device. The mode splitter device 50 is a switch which can be switched between the single channel mode and the parallel channel mode. Advantageously, the mode splitter device 50 provides a hardware interface and wiring scheme which allows the same head coil apparatus to be used in both the scanner modes. This provides a significant economic benefit to the 7 T MRI customer as they have to buy only one head coil apparatus instead of two.

Figure 10:
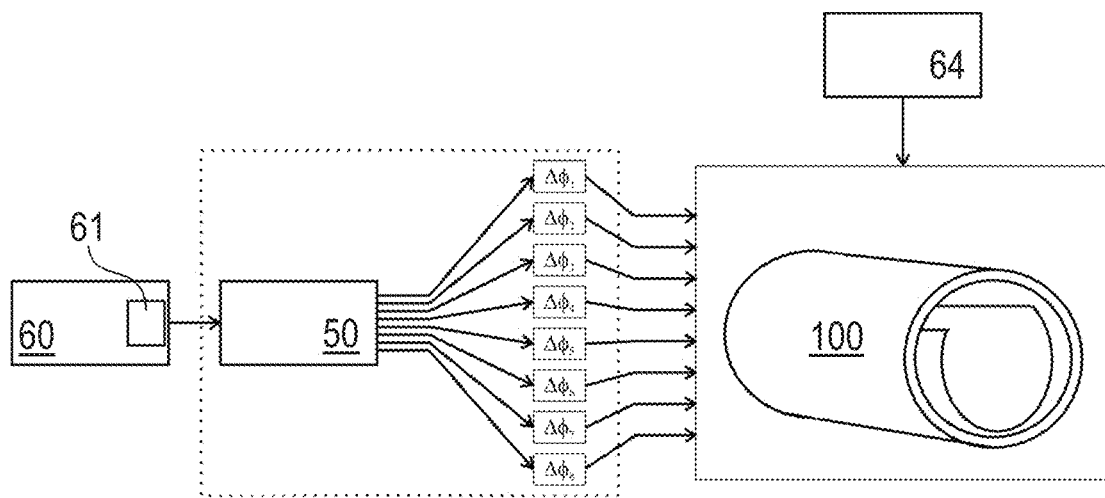
FIG. 10 illustrates an exemplary dual mode operation of the head coil apparatus according to embodiments of the invention.

The functional block diagram of the single channel sTx mode is shown in FIG. 10. For the sTx mode, a single channel RF amplifier 61 of the control device 60 is used for creating a single RF signal supplied to the mode splitter device 50. For the single channel mode, the mode splitter device 50 is switched to a configuration with one single input and a number of outputs equal to the number of transmit coil loops of the transmit coil array device, e. g. eight. A power splitter, e. g. a 1*8 power splitter, and a number of phase shifters (not shown) are arranged between the input and outputs. With the power splitter, the amplitude of each RF transmit signal can be adjusted, and with the phase shifters, the phase of each RF transmit signal can be adjusted. As a result, a number of RF transmit signals each with a specific amplitude and phase $\Delta\phi$, is simultaneously supplied to the transmit coil array device in the schematically shown head coil apparatus 100. Each of the transmit coils of the transmit coil array device is driven with a specific RF transmit signal with specific amplitude and phase $\Delta\phi$.

Figure 11:
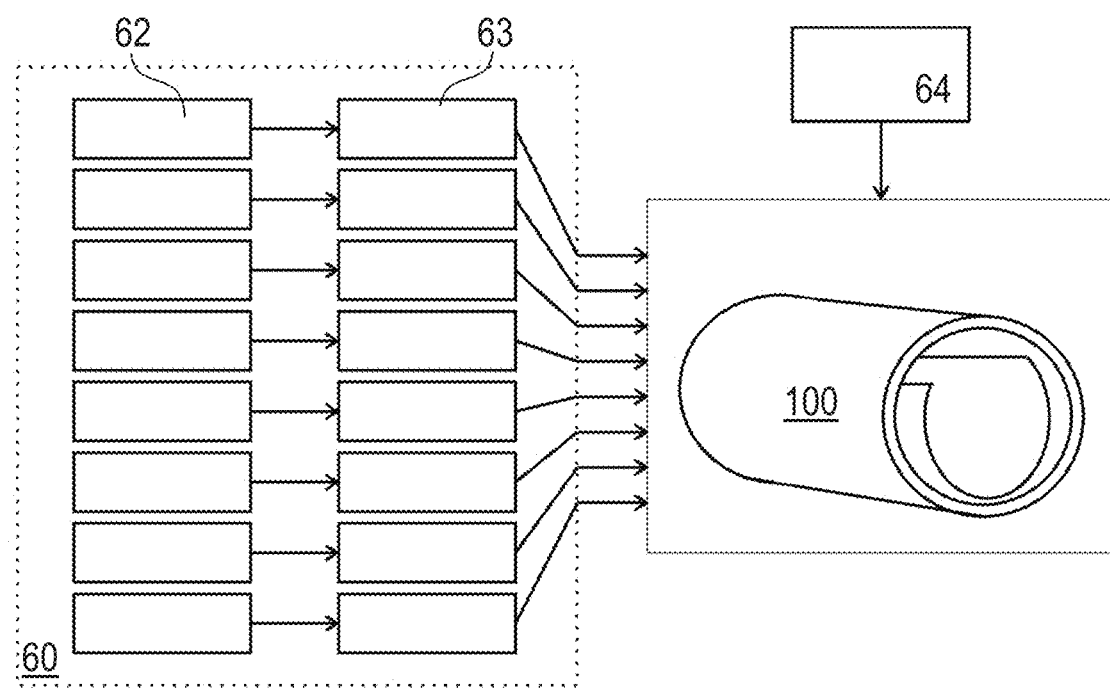
FIG. 11 illustrates another exemplary dual mode operation of the head coil apparatus according to embodiments of the invention.

The functional block diagram of the parallel channel pTx mode is shown in FIG. 11. In this case, all RF amplifiers 62 of the control device 60 are used for creating a number of RF signals each with a specific phase. Furthermore, the control device 60 includes power meters 63 for adjusting the amplitudes of the RF signals. In the parallel channel mode, the mode splitter device 50 is omitted and the eight outputs of the control device 60 are directly supplied to the eight transmit coil loops of the transmit coil array device. As a result, a number of RF transmit signals each with a specific amplitude and phase $\Delta\phi$, is simultaneously supplied to the trans-mit coil array device in the schematically shown head coil apparatus 100.

Preferably, the following wiring scheme is applied to control of the switching in sTx and pTx modes. The MRI scanner 200 (see FIG. 9) provides with a shared PIN bias control unit 64 control signals to switch ON/OFF the transmit and receive coils. These control signals are used to forward/reverse bias PIN diodes to turn ON and OFF the transmit coil loops and receive coils. Furthermore, all the control lines are independently programmable.

If there are x number of control lines in the scanner for x number of transmit channels, and there are y number of control lines in the scanner for y number of receive channels, the following scheme is implemented.

As an example, if there are 8 transmit channels and 32 receive channels, 40 control signals are needed. On transmit side, there are 1 single transmit channel in sTx mode and 8 transmit channels in pTx mode. There are 8 control lines in pTx mode to control the 8-channel transmit coil. However, there is nothing common between the two modes. On receive side, there are 32 receive channels in both sTx mode and pTx mode. So, there are 32 common control lines in sTx mode and pTx mode.

According to a preferred embodiment of the invention the common 32 control lines are shared with the shared PIN bias control unit 64, e. g. using a simple current dividing circuit, to control the 32 receive channels and 8 transmit channels. This wiring scheme together with the hardware interface facilitates dual-mode functionality. Advantageously, the input connector of the custom-built mode splitter device 50 can be the same as a conventional pTx connector in the MRI scanner 200.

The advantageous features of the inventive head coil apparatus have been shown with the following experimental tests. The head coil apparatus setup was tuned and matched using a head and shoulder phantom filled with tissue equivalent solution ($\varepsilon_r$=52.1 and $\sigma$=0.495/m). Measuring the S-parameters of the transmit coil array device in the presence of the actively detuned receive array provided results as expected by numerical simulations. Decoupling between adjacent elements was better than −18 dB. Coupling between the next neighbouring elements was reduced to less than 18 dB by nesting an inductor between them. The estimated loss due to the cutouts in the shield was less than 5%. The single channel mode will have an additional loss introduced by the mode splitter device 50 compared to the pTx mode. The transmit efficiency reached was within 5% of the widely used conventional commercial head coils. The transmit and receive performance and safety validation of the head coil apparatus was further characterized on the basis of the methods described in [13].

Figure 12:
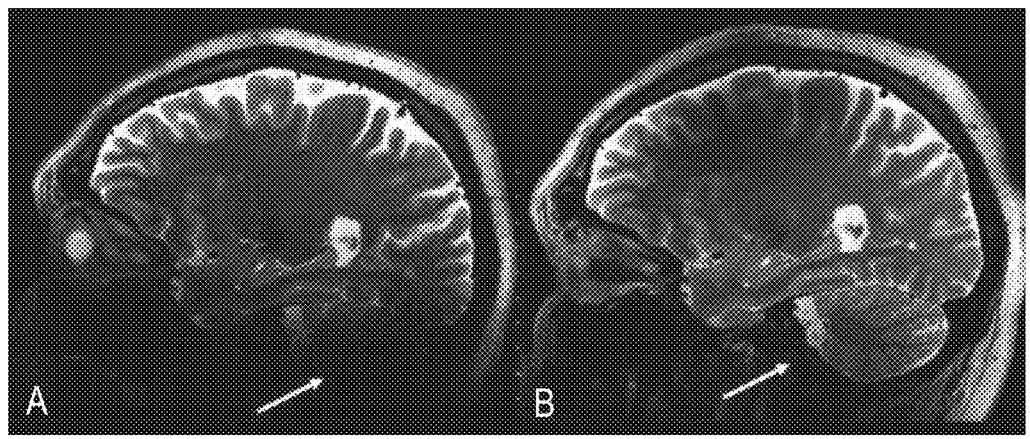
FIG. 12 illustrates an experimental result showing the improved brain coverage obtained with the embodiments.
Figure 13:
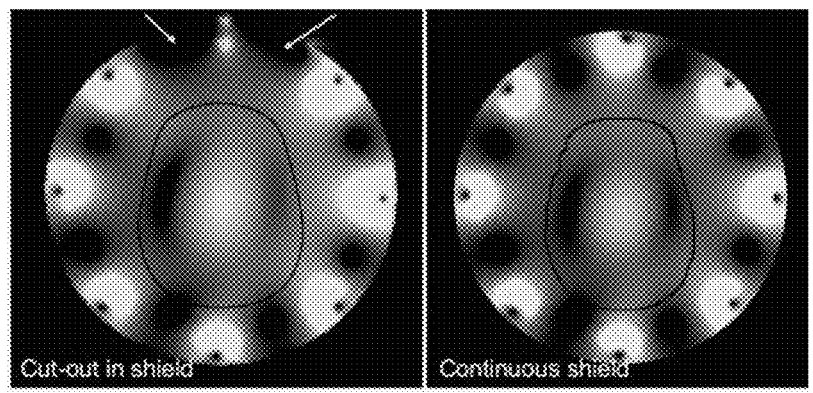
FIG. 13 illustrates an experimental result showing the neglectable effect of cut-outs in the RF shield, used according to the embodiments.

FIGS. 12 and 13 illustrate experimental results showing advantages of the first embodiment of the inventive head coil apparatus. FIG. 12A shows a sagittal slice showing lack of adequate coverage of the whole brain with a conventional head coil in sTx mode (see arrow). On the contrary, the inventive head coil apparatus provides whole brain coverage with sTx mode as shown in FIG. 12B.

FIG. 13 shows that a signal drop due to the cut-out in the RF shield (FIG. 13A) doesn't propagate on to the anatomy, so that the field within the head is equal to the field with the closed RF shield (FIG. 13B), thus allowing the open-face concept to be implemented at 7 T while retaining coil performance (transmit efficiency). In FIG. 13, arrows highlight the effect of cut-out in the RF shield. But this is not strong enough to propagate to the level of the head.

The features of the invention disclosed in the above description, the drawings and the claims can be of significance individually, in combination or sub-combination for the implementation of the invention in its different embodiments.

What is claimed is:

1. Head coil apparatus, being configured for magnetic resonance imaging (MRI) of a head of a person to be investigated, comprising
    a transmit coil array device being arranged for generating radiofrequency (RF) fields for spin state excitation to the head, wherein the transmit coil array device comprises multiple transmit coil loops, which are decoupled from each other and arranged on a transmit coil array carrier extending parallel to a longitudinal axis and surrounding an inner head coil space for receiving the head, wherein each transmit coil loop includes discreet capacitors being arranged for adjusting currents in the transmit coil loop and a resonance frequency of the transmit array device, a receive coil array device being arranged for receiving RF resonance signals from the head, an RF shield surrounding the transmit coil array device and the receive coil array device, and at least one head coil window providing a viewing port through the RF shield and the transmit coil array device, wherein the at least one head coil window has a longitudinal extension parallel to the longitudinal axis and an azimuthal extension along an azimuthal direction relative to the longitudinal axis, the transmit coil loops comprise neighboring window coil loops including at least one window coil loop surrounding the at least one head coil window, and the at least one window coil loop is decoupled from at least one neighbouring transmit coil loop by sharing the common loop conductor, wherein the capacitors of the neighbouring window coil loops are adjusted such that currents through the neighbouring window coil loops are balanced and there is no interaction between the neighbouring window coil loops.

2. Head coil apparatus according to claim 1, wherein the receive coil array device comprises multiple receive coils, which are arranged on a helmet-shaped receive coil array carrier, the receive coil array carrier spans the inner head coil space, and the viewing port provided by the at least one head coil window extends through the receive coil array device.

3. Head coil apparatus according to claim 1, further comprising a mirror device deflecting a light path from the inner head coil space to a monitoring range, wherein the light path extends from the inner head coil space trough the viewing port to the mirror device in a radial direction relative to the longitudinal axis and from the mirror device to the monitoring range parallel to the longitudinal axis.

4. Head coil apparatus according to claim 3, wherein the mirror device is movable relative to the at least one head coil window parallel to the longitudinal axis.

5. Head coil apparatus according to claim 1, wherein the longitudinal extension of the at least one head coil window is at least 5 cm.

6. Head coil apparatus according to claim 5, wherein the longitudinal extension of the at least one head coil window is at least 10 cm.

7. Head coil apparatus according to claim 1, wherein the azimuthal extension of the at least one head coil window is at least 4 cm.

8. Head coil apparatus according to claim 7, wherein the azimuthal extension of the at least one head coil window is at least 6 cm.

9. Head coil apparatus according to claim 1, comprising two head coil windows and two window coil loops, each of which surrounding one of the head coil windows, wherein the two window coil loops are decoupled by sharing the common loop conductor, so that the azimuthal extension of the head coil windows can be maximized.

10. Head coil apparatus according to claim 9, wherein the two window coil loops are arranged without mutual overlap.

11. Head coil apparatus according to claim 1, further comprising a mode splitter device being arranged for a dual mode operation of the transmit coil array device, wherein the mode splitter device is configured for direct connection of each transmit coil loop with a related control channel of a control device in a parallel operation mode or for splitting a common control channel of the control device to the transmit coil loops.

12. Head coil apparatus according to claim 1, further comprising a camera device being arranged for imaging a head section of the head of the person to be investigated through the at least one head coil window.

13. Magnetic resonance imaging (MRI) scanner apparatus, being configured for magnetic resonance imaging of a head of a person to be investigated, comprising the head coil apparatus according to claim 1, and a main magnetic field device with a central bore being arranged for receiving the Head coil apparatus with the head of the person to be investigated, wherein the main magnetic field device is arranged for creating a main magnetic field in the central bore, said main magnetic field having a field strength of equal to or above 7 T.

14. Method of magnetic resonance imaging (MRI) of a head of a person to be investigated, wherein the head coil apparatus according to claim 1 is used, comprising:

arranging the person to be investigated such that the head is received by the head coil apparatus and the person can view through the at least one head coil window, arranging the person with the head coil apparatus in the central bore of a MRI scanner apparatus, and collecting MRI data with the head coil apparatus.

15. Method according to claim 14, wherein the at least one head coil window is configured such that the person is capable to monitor the surrounding through the at least one head coil window.

16. Method according to claim 14, wherein the at least one head coil window is configured such that an operator is capable to monitor the person through the at least one head coil window.

17. Method according to claim 14, wherein the person is monitored with a camera device through the at least one head coil window.

18. Head coil apparatus, being configured for magnetic resonance imaging (MRI) of a head of a person to be investigated, comprising a transmit coil array device being arranged for generating radiofrequency (RF) fields for spin state excitation to the head, wherein the transmit coil array device comprises multiple transmit coil loops, which are decoupled from each other and arranged on a transmit coil array carrier extending parallel to a longitudinal axis and surrounding an inner head coil space for receiving the head, wherein each transmit coil loop includes discrete capacitors being arranged for adjusting currents in the transmit coil loop and a resonance frequency of the transmit array device, a receive coil array device being arranged for receiving RF resonance signals from the head, an RF shield surrounding the transmit coil array device and the receive coil array device, and a mode splitter device being arranged for a dual mode operation of the transmit coil array device, wherein the mode splitter device is configured for direct connection of each transmit coil loop with a related control channel of a control device being arranged for controlling the currents in the transmit coil loop in a parallel operation mode or for splitting a common control channel of the control device to the transmit coil loops.

19. Magnetic resonance imaging (MRI) scanner apparatus, being configured for magnetic resonance imaging of a head of a person to be investigated, comprising
  the head coil apparatus according to claim 18, and
  a main magnetic field device with a central bore being arranged for receiving the Head coil apparatus with the head of the person to be investigated, wherein
  the main magnetic field device is arranged for creating a main magnetic field in the central bore, said main magnetic field having a field strength of equal to or above 7 T.

20. Method of magnetic resonance imaging (MRI) of a head of a person to be investigated, wherein the MR scanner apparatus according to claim 19 is used, comprising:
  arranging the person to be investigated such that the head is received by the head coil apparatus and the person can view through the at least one head coil window,
  arranging the person with the head coil apparatus in the central bore of the MRI scanner apparatus, and
  collecting MRI data with the head coil apparatus.

\* \* \* \* \*